United States Patent [19]

Urano et al.

[11] Patent Number: 5,419,277

[45] Date of Patent: May 30, 1995

[54] METHOD AND APPARATUS FOR PRODUCING A CZOCHRALSKI GROWTH SEMICONDUCTOR SINGLE-CRYSTAL

[75] Inventors: Masahiko Urano, Takasaki; Michiaki Oda, Annaka, both of Japan

[73] Assignee: Shin-Etsu Handotai Co. Ltd., Tokyo, Japan

[21] Appl. No.: 191,658

[22] Filed: Feb. 4, 1994

[30] Foreign Application Priority Data

Feb. 10, 1993 [JP] Japan .................. 5-022398
Feb. 17, 1993 [JP] Japan .................. 5-027920

[51] Int. Cl.$^6$ ............................................. C30B 35/00
[52] U.S. Cl. ................................. 117/201; 117/217; 372/6
[58] Field of Search ............. 117/14, 15, 25, 201, 117/203, 210, 217, 904; 372/6, 7, 8, 16

[56] References Cited

U.S. PATENT DOCUMENTS

| | | | |
|---|---|---|---|
| 2,979,386 | 4/1961 | Shockley | 416/79 |
| 3,741,656 | 6/1973 | Shapiro | 117/201 |
| 4,508,970 | 4/1985 | Ackerman | 117/15 |
| 5,096,677 | 3/1992 | Katsuoka et al. | 117/217 |
| 5,170,061 | 12/1992 | Baba | 117/14 |
| 5,240,684 | 8/1993 | Baba et al. | 117/14 |

FOREIGN PATENT DOCUMENTS 301998  2/1989  European Pat. Off. .
455186 11/1991  European Pat. Off. .
1316707 12/1962 France .

*Primary Examiner*—Robert Kunemund
*Assistant Examiner*—Felisa Garrett
*Attorney, Agent, or Firm*—Nikaido Marmelstein Murray & Oram

[57] ABSTRACT

An apparatus for producing a semiconductor single-crystal grown by the Czochralski method includes a reference reflector disposed at the lower end of a gas rectifying tube, first and second optical systems disposed above the reference reflector for changing the direction of propagation of light from the horizontal to the vertical, and vice versa, a first position sensor composed of a first light source for emitting a light beam in a horizontal direction toward the first optical system, and a first photosensitive member which receives a reflection light reflected from the melt surface in a crucible, a second position sensor composed of a second light source for emitting a light beam in a horizontal direction toward the second optical system, and a second photosensitive member which receives a reflection light reflected from the reference reflector. With this construction, the distance between the gas rectifying tube and the melt surface can be detected and maintained constant throughout the crystal growth process with the result that the crystal quality, especially the concentration of dopant and impurities, such as oxygen and carbon, is uniform.

7 Claims, 3 Drawing Sheets

METHOD AND APPARATUS FOR PRODUCING A CZOCHRALSKI GROWTH SEMICONDUCTOR SINGLE-CRYSTAL

BACKGROUND OF THE INVENTION

1. Field of the Invention

The present invention relates generally to a method of and an apparatus for producing a semiconductor single-crystal grown by the Czochralski (CZ) method, and more particularly to a CZ semiconductor single-crystal growth system of the type having a gas rectifying tube and a position sensor for detecting the position or level of the melt surface in a crucible.

2. Description of the Prior Art

The Czochralski (CZ) method is known as a semiconductor single-crystal growth method in which a single crystal ingot is grown by pulling from the melt of a semiconductor material contained in a crucible. In an apparatus used for carrying out the CZ method, in order to control the concentration of a dopant and impurities, such as oxygen and carbon, in a growing crystal, the crucible is lifted with a change in the amount of the melt in the crucible to maintain the melt surface at a constant level during the entire crystal growth process. Especially in a CZ single-crystal growing apparatus of the type having a gas rectifying tube, the lower end of the gas rectifying tube and the melt surface must be kept in a constant positional relationship.

Accordingly, accurate detection and measurement of the position or level of the melt surface are required for achieving a precision control of the dopant and impurity concentrations in the growing crystal. In the case of the apparatus embodying the gas rectifying tube, the distance or spacing between the lower end of the gas rectifying tube and the melt surface must be detected and measured with accuracy.

FIG. 3 diagrammatically shows a position sensor associated with a conventional CZ semiconductor single-crystal growing apparatus 40 for detecting the position of the melt surface. The conventional position sensor is constructed such that a beam of light emitted from a light source 42 passes through a first view port 46 on a chamber 44 and strikes upon the surface of a melt M contained in a quartz crucible C. A reflection light reflected from the melt surface propagates through a second view port 48 and is received by a photosensitive member 50. The photosensitive member 50 detects the position of the melt surface depending on the position of the reflection light received on which position is variable with a change in position of the melt surface.

However, the position sensor of the foregoing construction cannot operate properly when a growing single-crystal or a gas rectifying tube is present in the chamber. This is because, due to the presence of an obstacle (i.e., the growing single-crystal or the gas rectifying tube) that blocks propagation of light, the light beam is prevented from reaching the melt surface or the reflection light is prevented from reaching the photosensitive member. The conventional position sensor can be used only for the measurement of the position of the melt surface.

During the crystal growth process, the gas rectifying tube undergoes thermal expansion and contraction, and the amount of thermal expansion and contraction varies in a complicated manner. As a consequence of such thermal expansion and contraction of the gas rectifying tube, the distance between the lower end of the gas rectifying tube and the melt surface varies too.

As previously mentioned, this distance should preferably be maintained constant throughout the crystal growth process, otherwise the crystal characteristics of the growing crystal, especially the concentration of dopant and impurities, such as oxygen and carbon, becomes irregular and unstable.

SUMMARY OF THE INVENTION

With the foregoing drawbacks of the prior art in view, the present invention seeks to provide a method of and an apparatus which are capable of producing a CZ semiconductor single-crystal with better uniformity in crystal characteristics such as concentration of dopant and impurities including oxygen and carbon, by detecting the distance between the melt surface and the lower end of a gas rectifying tube in a chamber to maintain this distance constant during the entire crystal growth process.

To attain the foregoing object, the invention provides an apparatus for producing a semiconductor single-crystal grown by the Czochralski method, which comprises: a reference reflector disposed at the lower end of a gas rectifying tube and defining a reference point; first and second optical systems disposed above the reference reflector for changing the direction of propagation of light from the vertical and the horizontal, and vice versa; a first position sensor composed of a first light source for emitting a beam of light in a first horizontal direction toward the first optical system, and a first photosensitive member which receives a reflection light reflected from the melt surface in the crucible; and a second position sensor composed of a second light source for emitting a beam of light in a second horizontal direction toward the second optical system, and a second photosensitive member which receives a reflection light reflected from the reference reflector.

By using a single, movable position sensor, one of the first and second position sensors and a corresponding one of the first and second optical systems can be omitted. The movable position sensor may comprise a light source such as a laser which emits a light beam (laser beam) selectively onto the melt surface and the reference reflector, and a photosensitive member which receives a reflection light reflected from the melt surface and a reflection light reflected from the reference reflector. In this instance, if the light receiving area of the photosensitive member is sufficiently large, and if the light source is made movable or pivotable to change the angle of emission of the light beam, the same result as described above can be obtained without moving the entire position sensor. Any other mechanism or arrangement may be employed for a movable position sensor provided that a light beam emitted from a single light source selectively strikes on the melt surface in the crucible and the reference reflector, and a reflection light reflected from the melt surface and a reflection light reflected from the reference reflector are received by a single photosensitive member.

When the melt surface and the reference point are to be detected by the apparatus of the present invention, a light beam propagates through the optical system (prism, for example) to the melt surface with a slight angle of incidence formed between the light beam and the vertical (i.e., the perpendicular of incidence). At least a portion of the light beam is reflected from the melt surface, and a reflection light reflected from the melt surface propagates to the optical system at an angle of reflection which is equal to the angle of incidence. The reflection light is then detected by the photosensitive member. Since the optical path of the incident light (light beam) is slightly angled or tilted to the vertical, the point of projection of the reflection light on the photosensitive member varies with a change in the level of the melt surface. By using this phenomenon, the level of the melt surface can be detected.

In contrast, when the light beam is projected onto the melt surface along a vertical optical path, a reflection light reflected from the melt surface propagates along the same vertical optical path as the incident light beam. The optical path thus arranged is not suited for the apparatus of the invention in terms of the detection of the melt surface.

It is, therefore, important that, for enabling the melt level detection, the light beam striking onto the melt surface forms with the vertical axis (i.e., the perpendicular of incidence) a slight angle of incidence. Thus, a reflection light reflected from the melt surface propagates along a different optical path than the light beam (incident light).

In a CZ semiconductor single-crystal growing method carried out by the apparatus of the present invention, the relative position between the melt surface and the reference point defined by the reflector can be freely adjusted during the growth process.

According to the present invention, by using a narrow internal space at an upper portion of the CZ semiconductor single-crystal growing apparatus, a reference reflector defining a reference point is disposed at the lower end of a gas rectifying tube, and at least one optical system is disposed above the reference point for changing the direction of propagation of light from the vertical to the horizontal, and vice versa. At least one optical position detecting means or sensor is disposed outside the chamber of the apparatus and aligned in the horizontal direction with the optical system. The optical position sensor emits a light beam selectively onto the melt surface and the reference reflector and receives a reflection light reflected from the melt surface and a reflection light reflected from the reference reflector point to detect the level of the melt surface and the level of the reference point for controlling the distance between the melt surface and the lower end of the gas rectifying tube.

The above and other objects, features and advantages of the present invention will become manifest to those versed in the art upon making reference to the detailed description and the accompanying sheets of drawings in which preferred structural embodiments incorporating the principle of the present invention are shown by way of illustrative example.

DETAILED DESCRIPTION OF THE INVENTION

Figure 1:
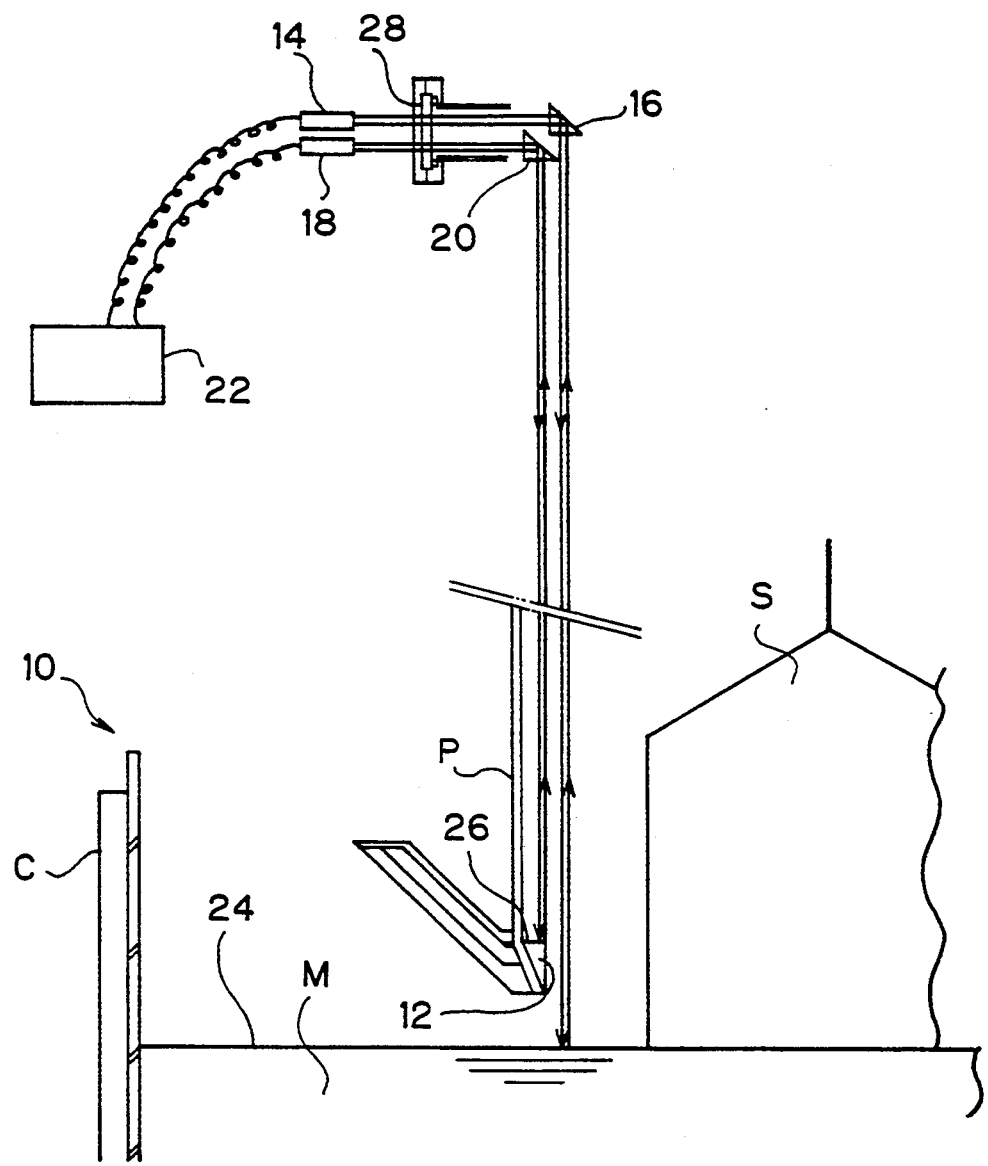
FIG. 1 is a diagrammatical view showing a main portion of a CZ semiconductor single-crystal growing apparatus according to one embodiment of the present invention.

Referring now to FIG. 1, there is shown an apparatus 10 embodying the present invention for producing a semiconductor single-crystal grown by the CZ method.

The apparatus 10 includes a quartz crucible C for holding therein a melt M of semiconductor material such as silicon, and a gas rectifying tube P concentric with the crucible and disposed immediately above the melt surface 24 so as to encircle or surround a semiconductor single-crystal being grown by pulling from the melt M. The gas rectifying tube P has a circular cylindrical shape or a downwardly tapering configuration. A reference reflector 12 is disposed at a lower end (front end) of the gas rectifying tube P and defines a reference point 26.

A first position detecting means or sensor denoted at 14 is disposed outside a chamber (not designated) of the apparatus 10. The first position sensor 14 is composed of a first light source and a first photosensitive member, neither shown. Numeral 16 denotes a first optical-path changing optical system, such as a prism, which is disposed within the chamber and aligned in horizontal direction with the first position sensor 14 for changing the direction of propagation of light from the horizontal to the vertical, and vice versa. The first optical-path changing optical system 16 (hereinafter referred to, for brevity, as "first optical system") is disposed above the reference reflector 12 but held out of vertical alignment with the reference point 26.

Likewise, a second position sensor 16 is disposed outside the chamber of the apparatus 10 and includes a second light source and a second photosensitive member, neither shown. A second optical-path changing optical system denoted at 20 comprises a prism, for example, and is disposed in horizontal alignment with the second position sensor 18 within the chamber for changing the direction of propagation of light from the horizontal to the vertical, and vice versa. The second optical-path changing optical system 20 (hereinafter referred to, for brevity, as "second optical system") is disposed directly above the reference point 26 defined by the reference reflector 12.

An arithmetic and logic unit denoted at 22 is electrically connected with the first position sensor 14 and the second position sensor 18 for computing the level of the melt surface 24, the level of the reference point 26, and the distance between the melt surface 24 and the reference point 26 (viz., the lower end of the gas rectifying tube P) according to data supplied from the first and second position sensors 14, 18.

Numeral 28 denotes a view port provided on the apparatus 10 at an upper portion of the chamber. Beams of light emitted from the first and second light sources, respectively, propagate through the view port 28 into the chamber, and reflecting lights reflected back from the chamber propagate through the view port 28 to the first and second photosensitive members, respectively.

The apparatus 10 of the foregoing construction operates as follows.

The first light source of the first position sensor 14 emits a beam of light, such as a laser beam, in a horizontal direction toward the first optical system (prism) where the laser beam is directed vertically downwardly toward the melt surface 24. At least a portion of the light beam is reflected by the melt surface 24, and a reflection light reflected from the melt surface 24 propagates back in a vertically upward direction to the first optical system 16 where the reflection light changes its direction of propagation from the vertical to the horizontal. The reflecting light is finally received by the first photosensitive member of the first position sensor 14. The first position sensor 14 supplies detected data to the arithmetic and logic unit 22.

Likewise, the second light source of the second position sensor 18 emits a light beam, such as a laser beam, in a horizontal direction toward the second optical system (prism) 20 where the laser beam is directed vertically downwardly toward the reference reflector 12. The light beam is reflected by the reflector 12, and a reflection light reflected from the reference point 26 propagates back in a vertically upward direction to the second optical system 20 where the reflection light changes its direction of propagation from the vertical to the horizontal. Thereafter, the reflection light is received by the second photosensitive member of the second position sensor 18 which in turn supplies detected data to the arithmetic and logic unit 22.

In the arithmetic and logic unit 22, the detected data on the level of the melt surface 24 and the detected data on the reference point 26 are subjected to an arithmetic operation or computation so as to determine the distance between the melt surface 24 and the reference point 26 (viz., the lower end of the gas rectifying tube P). The distance thus obtained is used to control the relative position between the melt surface 24 and the lower end of the gas rectifying tube P.

In the embodiment just described above, the optical path of each of the light beams (incident light) and the optical path of a corresponding one of the reflecting lights are described as extending in a vertically downward direction and a vertically upward direction, respectively. This is only for illustrative purposes. As previously mentioned, detection of the melt surface, for example, is not achievable under the condition that the incident light and the reflection light propagate along the same optical path. It is, therefore, necessary to direct the light beam toward the melt surface, for example, in such a manner that the light beam forms with the vertical axis (perpendicular of incidence) a slight angle of incidence.

The first and second position sensors 14 and 18 used in the embodiment described above are stationary or fixed in position. These stationary position sensors 14, 18 may be replaced by a single, movable position sensor which is constructed to detect both of the data on the melt surface 24 and the data on the reference point 26.

Figure 2:
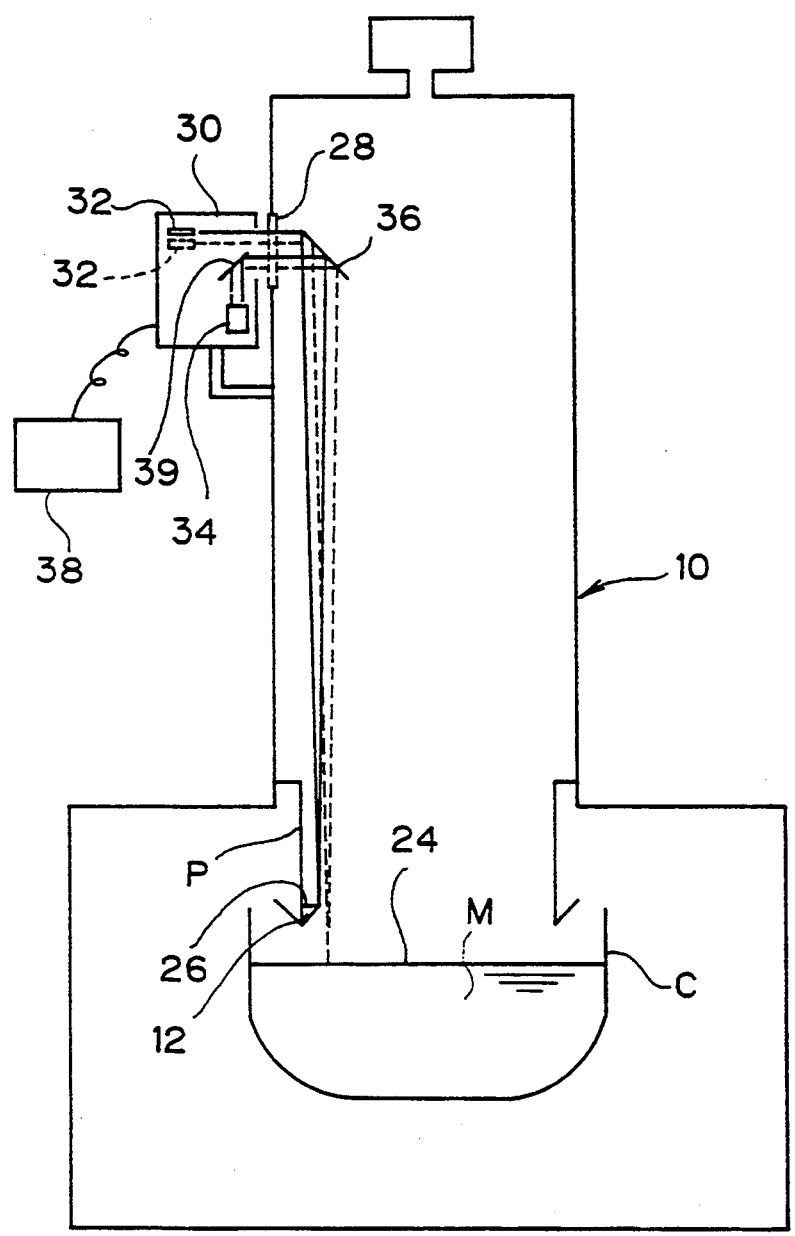
FIG. 2 is a view similar to FIG. 1, but showing another embodiment of the present invention.
Figure 3:
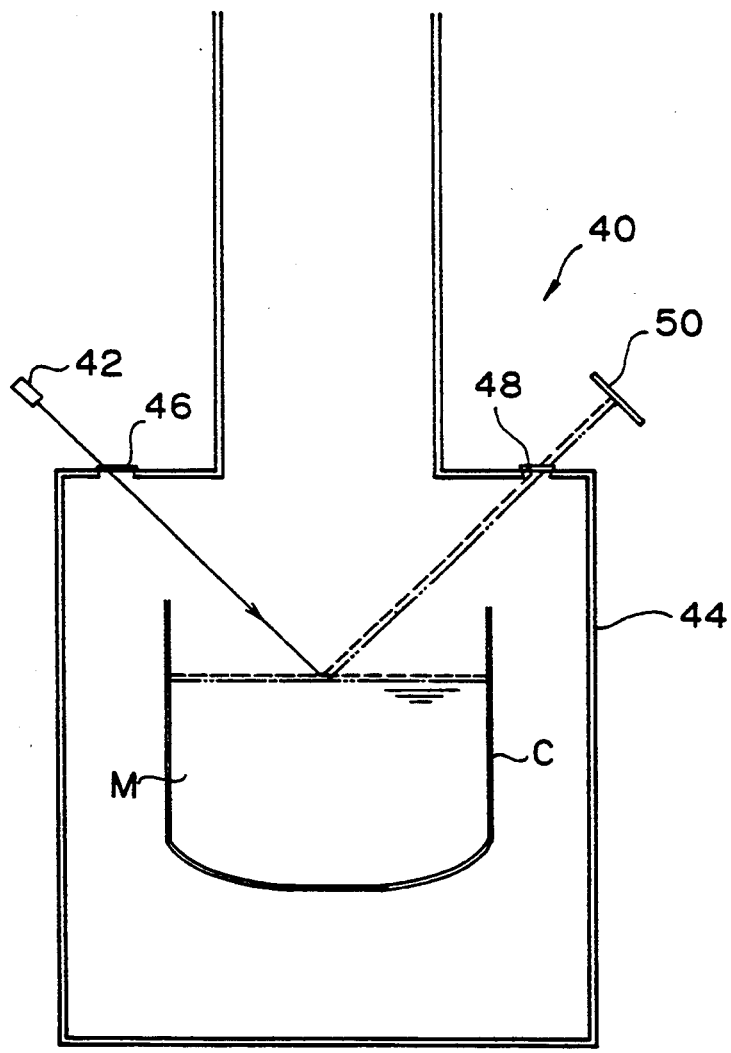
FIG. 3 is a diagrammatical view showing an optical detection system incorporated in a conventional CZ semiconductor single-crystal growing apparatus for detecting the level of the melt surface.

One such movable position sensor is exemplified in FIG. 2. The movable position sensor designated by 30 is disposed outside the chamber of the apparatus 10 and includes a light source 32 and a photosensitive member 34. An optical-path changing optical system 36 is disposed above the reference reflector 12 within the chamber and aligned in horizontal direction with the position sensor 30. The optical-path changing optical system 36 (hereinafter referred to for brevity as "optical system") comprises a pentaprism, for example, and changes by reflection the direction of propagation of light from the horizontal to the vertical, and vice versa.

An arithmetic and logic unit designated at 38 is electrically connected with the position sensor 30 and computes the level of the melt surface 24, the level of the reference point 26 defined by the reference reflector 12, and the distance between the melt surface 24 and the reference point 26 (viz., lower end of the gas rectifying tube P) according to detected data supplied from the position sensor 30. In FIG. 2 these reference characters which are identical to those shown in FIG. 1 designate the like or corresponding parts.

Operation of the apparatus shown in FIG. 2 will be described below.

At first, the position sensor 30 is set in a position indicated by the solid lines. Then, the light source 32 emits a light beam, such as a laser beam, in a horizontal direction toward the optical system (pentaprism) 36 where the light beam changes its direction of propagation from the horizontal direction to a vertically downward direction. The light beam then strikes on an upper surface (viz., the reference point 26) of the reference reflector 12. A reflection light reflected from the reference reflector 12 propagates in a vertically upward direction and strikes on the optical system 36 where the reflecting light changes its direction of propagation from the vertically upward direction to a horizontal direction. Then the reflection light strikes on a mirror 39 disposed in front of the photosensitive member 34. The mirror 39 reflects the reflection light toward the photosensitive member 34 of the position sensor 30. Thus, data on the reference point 26 is detected. The detected data on the reference point 26 is subsequently supplied from the position sensor 30 to the arithmetic and logic unit 38.

Then, the position sensor 30 as a whole is displaced downwardly until the light source 32 assumes its lower position indicated by the broken lines. Though not specifically illustrated, the photosensitive member 34 also assumes its lower position. The light source 32 again emits a light beam (laser beam) in a horizontal direction toward the optical system (pentaprism) 36 which directs the light beam by reflection toward a vertically downward direction. The light beam then strikes on the melt surface 24, and a reflection light reflected from the melt surface 24 propagates back in a vertically upward direction to the optical system (pentaprism) 36 where the reflection light is directed in a horizontal direction toward the mirror 39. The reflection light is then reflected again by the mirror 39 and finally received by the photosensitive member 34 of the position sensor 30. Thus, data on the melt surface is detected. The detected data is then supplied from the position sensor 30 to the arithmetic and logic unit 38. The arithmetic and logic unit 38 computes the level of the reference point 26, the level of the melt surface 24, and the distance between the reference point 26 (viz., the lower end of the gas rectifying tube P) and the melt surface 24 according to the detected data supplied from the position sensor 30. The terms "vertically downward direction" and "vertically upward direction" used to refer to the direction of propagation of light should be construed as being used only for a purpose of illustration. To be more exact, as shown in FIG. 2, the incident light (i.e., the light beam striking on the melt surface 24 or the reference reflector 12) forms with the vertical axis (viz., the perpendicular of incidence) a slight angle of incidence, and the reflection light reflected from the melt surface 24 or the reference reflector 12 forms with the vertical axis a slight angle of reflection which is equal to the angle of incidence. The position sensor 30 previously mentioned is vertically movable as a whole so that the light source 32 and the photosensitive member 34 are simultaneously displaced in a vertical direction. As an alternative, the light source 32 may be vertically movable while photosensitive member 34 is fixed or stationary.

As described above, according to the invention, even when a gas rectifying tube is present in the chamber concurrently and while a single-crystal is being grown by pulling from the melt, the distance between the gas rectifying tube and the melt surface can be measured. In the case where the gas rectifying tube undergoes thermal expansion and contraction during the crystal growth, an amount of thermal deformation of the gas rectifying tube is compensated for according to the data detected by the position sensor/sensors with the result that distance between the gas rectifying tube and the melt surface can be maintained constant throughout the crystal growth process. Accordingly, the resultant single crystal has better uniformity in crystal characteristics, and especially the concentration of dopant and impurities, such as hydrogen and carbon is highly stable and homogeneous.

Obviously, various minor changes and modifications of the present invention are possible in the light of the above teaching. It is therefore to be understood that within the scope of the appended claims the invention may be practiced otherwise than as specifically described.

What is claimed is:

1. An apparatus for producing a semiconductor single-crystal grown by the Czochralski method, for use with a gas rectifying tube having a circular cylindrical shape or a downwardly tapering configuration concentric with a crucible and disposed immediately above the surface of a melt in the crucible so as to surround a single-crystal being grown, comprising:
   a reference reflector disposed at a lower end of a gas rectifying tube and defining a reference point;
   a first optical system and second optical system disposed above said reference reflector for changing a direction of propagation of light from a horizontal to a vertical, and vice versa;
   a first position sensor composed of a first light source for emitting a beam of light in a first horizontal direction toward said first optical system, and a first photosensitive member which is capable of receiving a reflection light reflected from a melt surface in the crucible; and
   a second position sensor composed of a second light source for emitting a beam of light in a second horizontal direction toward said second optical system, and a second photosensitive member which receives a reflection light reflected from said reference reflector.

2. An apparatus according to claim 1, wherein said light beam emitted from said first light source of said first position sensor strikes on the melt surface at a slight angle to the vertical for enabling detection of the melt surface, and said light beam emitted from said second light source of said second position sensor strikes on said reference reflector at a slight angle to the vertical for enabling detection of said reference point.

3. An apparatus for producing a semiconductor single-crystal grown by the Czochralski method, for use with a gas rectifying tube having a circular cylindrical shape or a downwardly tapering configuration concentric with a crucible and disposed immediately above the surface of a melt in the crucible so as to surround a single-crystal being grown, comprising:
   a reference reflector disposed at a lower end of a gas rectifying tube and defining a reference point;
   an optical system disposed above said reference reflector for changing a direction of propagation of light from a horizontal to a vertical, and vice versa; and
   a position sensor composed of a light source for emitting a beam of light in a horizontal direction toward said optical system, and a photosensitive member which receives a reflected portion of the light beam, wherein said position sensor is movable so that the light beam emitted from said light source is capable of selectively striking upon a melt surface in the crucible and said reference reflector, and wherein a reflection light reflected from the melt surface and a reflection light reflected from said reference reflector are capable of being received by said photosensitive member.

4. An apparatus according to claim 3, wherein said light beam selectively striking on the melt surface and said reference reflector forms with the vertical a slight angle of incidence for enabling detection of the melt surface and said reference point.

5. An apparatus according to claim 3 or 4, said position sensor as a whole is vertically movable so that said light source and said photosensitive member are simultaneously displaced in a vertical direction.

6. An apparatus according to claim 3 or 4, wherein said light source is vertically movable, and said photosensitive member is stationary.

7. A method of producing a semiconductor single-crystal grown by the apparatus of claim 1 or 3, characterized in that the relative position between the melt surface and said reference point defined by said reference reflector is adjustable to maintain the distance between the melt surface and the gas rectifying tube constant during the entire crystal growth process.

* * * * *